United States Patent [19]

Landt

[11] 4,431,974

[45] Feb. 14, 1984

[54] EASILY TUNED IMPATT DIODE MODULE

[75] Inventor: Donnie L. Landt, Marion, Iowa

[73] Assignee: Rockwell International Corporation, El Segundo, Calif.

[21] Appl. No.: 350,699

[22] Filed: Feb. 22, 1982

[51] Int. Cl.³ .............................................. H03B 7/14
[52] U.S. Cl. ............................ 331/107 DP; 330/287; 331/107 SL; 333/33; 333/247
[58] Field of Search .................... 333/33, 35, 245, 247; 330/53, 56, 287; 331/107 DP, 107 SL; 329/162

[56] References Cited

U.S. PATENT DOCUMENTS

| | | | |
|---|---|---|---|
| 3,638,141 | 1/1972 | Levine et al. | 333/33 X |
| 3,909,740 | 9/1975 | Clorfeine | 330/53 X |
| 3,916,350 | 10/1975 | Swan | 333/33 X |
| 3,943,463 | 3/1976 | Kuno et al. | 330/287 X |
| 3,969,689 | 7/1976 | Corrons et al. | 331/107 SL |
| 4,186,358 | 1/1980 | Czech et al. | 333/33 |
| 4,365,214 | 12/1982 | Shillady | 333/245 X |

OTHER PUBLICATIONS

Newton, *M.I.C. TRAPATT Oscillator for Efficient S Band Operation*, Electronics Letters, vol. 11, No. 14, Jul. 10, 1975, pp. 299–300.

*Primary Examiner*—Paul L. Gensler
*Attorney, Agent, or Firm*—George A. Montanye; Howard R. Greenberg; H. Fredrick Hamann

[57] ABSTRACT

An improved microwave circuit is disclosed for enabling impedance tuning for power coupling in IMPATT diode and other similar oscillator and amplifier circuits. An electrically conductive support plate forming a ground plane is machined to form a channel for slidably receiving an air-stripline transmission line and a resonator therein. An IMPATT diode is positioned within the channel through an opening extending through the support plate generally perpendicular to the channel and is positioned in contact with the resonator. An electrically conductive bias filter is coupled to the resonator and to an adjusting mechanism for moving the resonator along the channel and providing a DC bias to the diode for oscillation. An electrically conductive cover member retains a spring biased electrically non-conductive projection for maintaining the resonator in contact with the diode. By controlling the adjusting mechanism and the position of the air-stripline within the channel, the real and imaginary parts of diode impedance can be adjusted to change the frequency and match the impedance of the diode to a conventional transmission line or coupling circuit.

12 Claims, 5 Drawing Figures

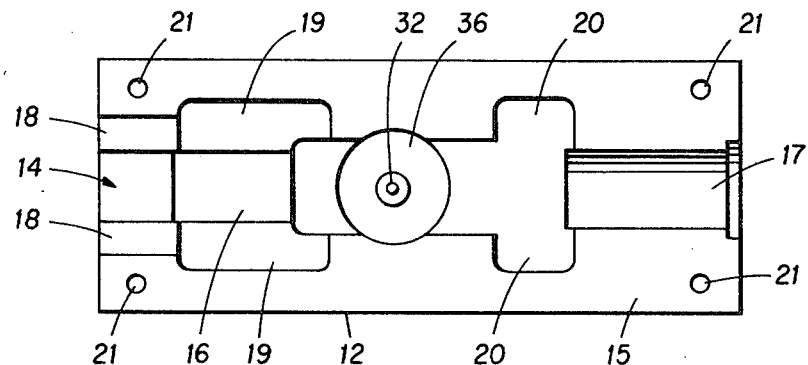
FIG 1
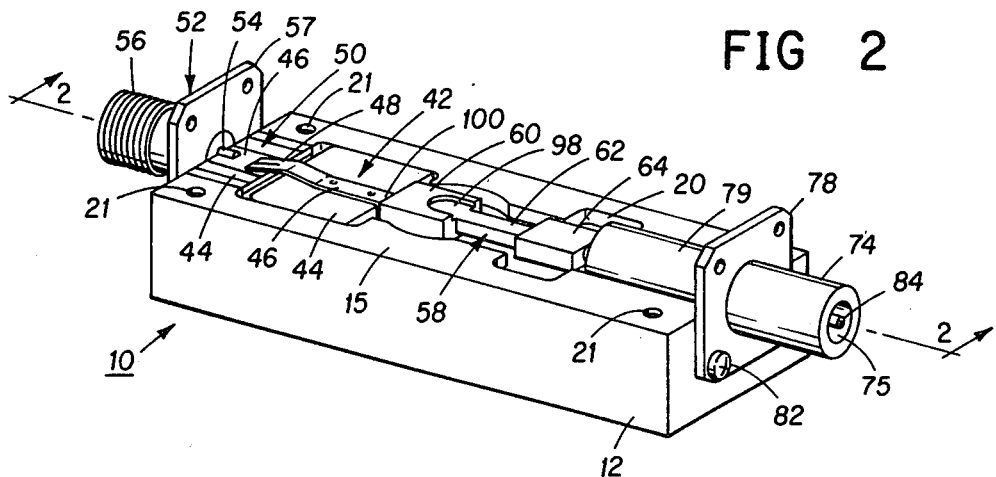
FIG 2
FIG 4
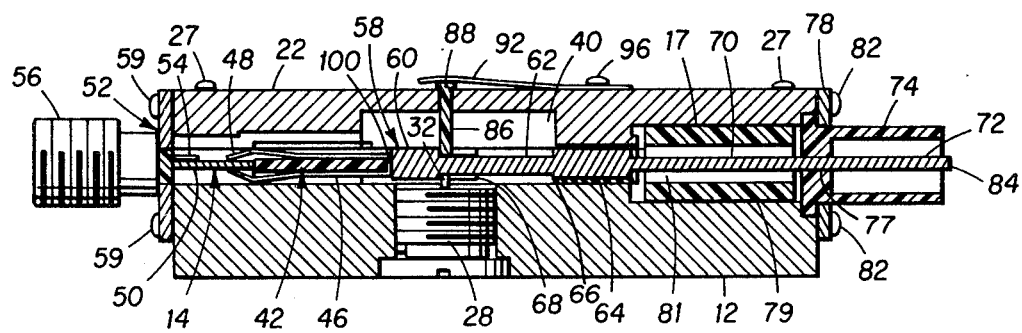

EASILY TUNED IMPATT DIODE MODULE

BACKGROUND OF THE INVENTION

The present invention relates to an improved microwave circuit and more particularly to an improved structure for providing tunable impedance matching for IMPATT diodes and similar devices.

IMPATT diodes are semiconductor devices which generate microwave power in GHz ranges. Their power output and efficiency are dependent upon the provision of a proper impedance match when operated as oscillators or amplifiers. Generally, since each diode will have characteristics different from any other diode, it is difficult to provide oscillators of reproducible characteristics or to maximize the operating characteristics of a circuit even when the diodes are produced by the same process. Because of the need for high power circuits in new technology systems, power coupling from diodes to transmission lines and other systems in oscillator and amplifier circuits has become more critical. As a result, various techniques have been proposed to couple IMPATT diodes and similar devices in circuits designed to improve their efficiency and power output.

In present systems, it is particularly desirable to combine a number of diodes to produce increased power output. Since no two IMPATT diodes are the same, the circuits necessary to combine the outputs are somewhat inefficient and complex. While there have been attempts to combine only diodes having similar characteristics, matching is difficult and tedious and is often abandoned at the expense of circuit performance. Other attempts have sacrificed the efficiency of diode operation by providing a greater number of diodes in a circuit so that a decrease in performance of a few diodes will not affect the overall operation of the circuit.

In other instances, impedance matching devices have been used to match the characteristics of a diode to a specific circuit. Microwave cavity and transmission line circuits have been used to provide a predetermined impedance match to an IMPATT diode. In such cases, however, the impedance cannot be changed and a separate impedance device must be used for each IMPATT diode. In other instance, a combining circuit is constructed with portions for matching impedance depending on the particular diode attached in the combining circuit. In these instances also, the combination can only receive diodes having identical characteristics in order for maximum power and efficiency to be achieved. Accordingly, if one of the diodes becomes inoperable in the combiner circuit, it must be replaced by an identical diode or the efficiency of the circuit will be decreased. The versatility of the coupler is therefore limited since it cannot accommodate diodes of different characteristics.

In addition to the above limitations, prior known devices are generally not acceptable for providing impedance matching in the miniaturized circuits of current technology. Transmission line and wave-guide matching techniques, for example, increase the size and weight requirements of a system where impedance matching is necessary. In many of the systems, the size and weight become critical and the transmission line and wave-guide coupling and impedance matching devices are unsuitable for use. Since present microwave systems employ a wide variety of power combining circuits coupled to utilize the power provided by IMPATT diodes and similar devices, there is a need for additional microwave impedance matching and tuning devices which interface with miniaturized circuits.

Accordingly, the present invention has been developed to overcome the specific shortcomings of the above known and similar techniques and to provide a simple and inexpensive microwave coupling circuit for matching and tuning impedance in IMPATT diode oscillator and amplifier circuits.

SUMMARY OF THE INVENTION

In accordance with the present invention, an impedance matching and tuning circuit is constructed for use with IMPATT diodes. An electrically conductive support forming a ground plane includes a longitudinal channel extending over one surface of the support. At one end of the channel a conventional connector or transmission line is coupled to provide circuit output. A movable air-stripline transmission line section is coupled to and located adjacent the connector for slidable movement in the channel of the support. An electrically conductive resonator is slidably received adjacent the movable air-stripline and is mechanically coupled to an adjusting mechanism at the opposite end of the channel to move the resonator longitudinally in said channel. An IMPATT diode is positioned within the channel through an opening which extends generally perpendicular to the channel so that it is maintained in sliding contact with the resonator. An upper electrically conductive cover plate retains a spring biasing member to maintain the resonator in electrical contact with the IMPATT diode when the cover is in place. The resonator is moved by the adjusting mechanism to change the imaginary part of the impedance seen by the diode and thus also the diode frequency. The air-stripline is then used to change the real part of the impedance presented to the diode for matching to the transmission line by movement along the channel. A DC voltage input is coupled through the adjusting mechanism to bias the diode for oscillation.

It is therefore a feature of the invention to provide a simple and inexpensive microwave impedance tuning circuit.

It is a further feature of the invention to provide a microwave impedance tuning circuit for use with IMPATT diodes and similar devices for improving power coupling and efficiency.

It is another feature of the invention to provide a microwave impedance matching and tuning device which can be operated to provide impedance matching for a variety of IMPATT diodes.

A still further feature of the invention is to provide a tunable microwave impedance circuit which exhibits low loss.

Yet another feature of the invention is to provide a microwave impedance matching circuit for IMPATT diodes which can be constructed for miniaturized use.

Still another feature of the invention is to provide a microwave impedance matching device which enables easy coupling of plural circuits with air-stripline combining networks.

These and other advantages and novel features of the invention will become apparent from the following detailed description when considered with the accompanying drawings wherein:

BRIEF DESCRIPTION OF THE DRAWINGS

FIG. 1 is a top view of the conductive support of the impedance matching device of the present invention.

FIG. 2 is a perspective view of the impedance matching device with the cover removed.

FIG. 4 is a side sectional view of the impedance matching device taken along the line 2—2 in FIG. 2.

DETAILED DESCRIPTION OF A PREFERRED EMBODIMENT

Figure 3:
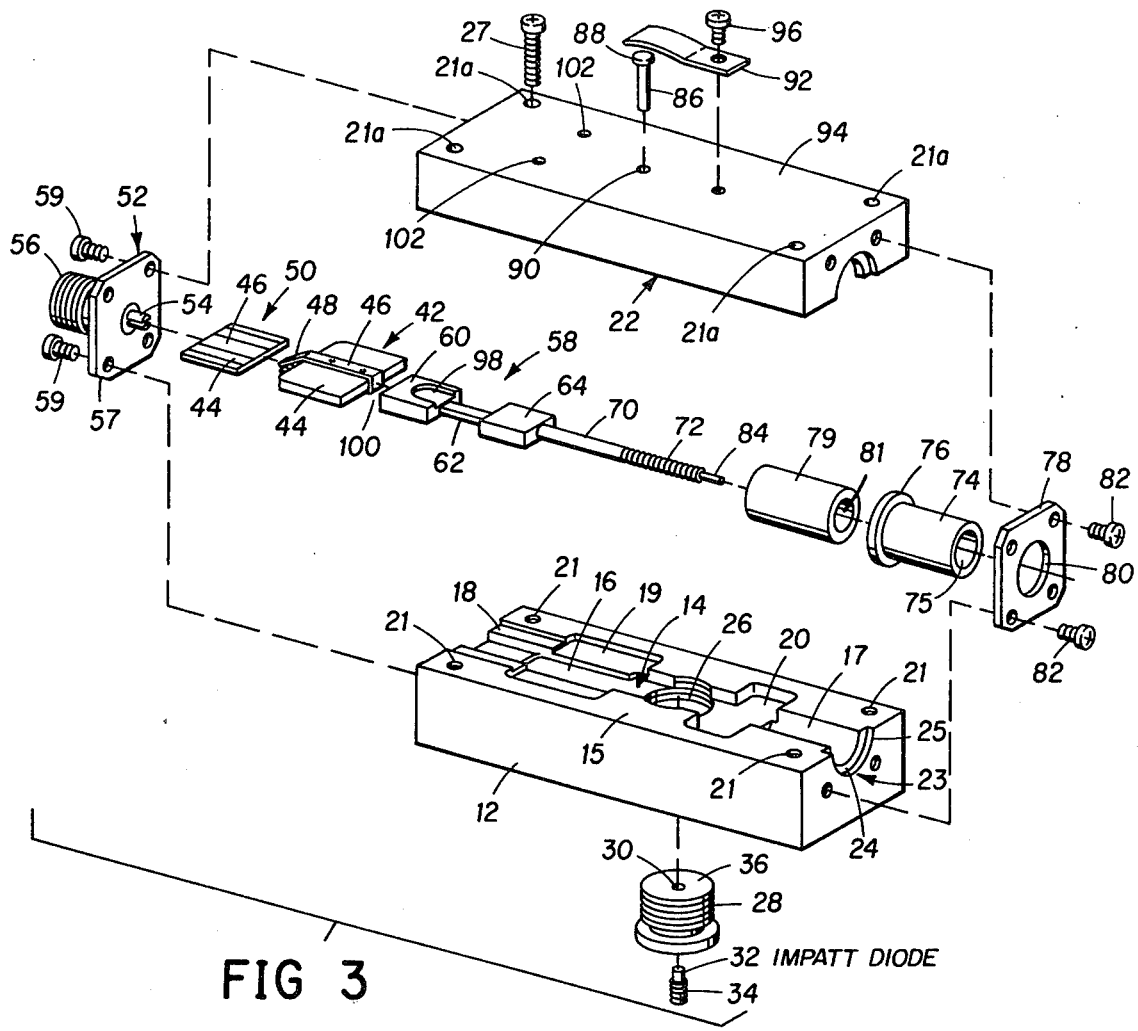
FIG. 3 is an exploded perspective view of the impedance matching device.

Referring now to the drawings, a tunable microwave impedance matching device is generally shown at 10 in the Figures wherein like numerals are used to refer to like elements throughout. In the present instance, the microwave device 10 is described with reference to its use with an IMPATT diode for which it is particularly capable of providing improved tunable impedance matching characteristics. However, it will become apparent that the structure is equally applicable to similar devices where it is desired to provide tunable impedance matching for elements of diverse impedance characteristics. When IMPATT diodes are used in connection with the present device, a tunable module is produced which can provide improved microwave power output, particularly in the C and X band ranges. The device can be used in connection with weather radar transmitters, communication systems, and other applications where high power output in a particular microwave range is required.

Referring first to FIGS. 1 and 3, there is shown electrically conductive support member 12 which forms the ground plane of the tunable impedance device 10. In the present example, the support 12 may be a rectangular aluminum block having channel 14 machined longitudinally through a surface 15 of the support 12. The channel 14 has a generally U-shaped portion 16 aligned with a semi-cylindrical portion 17. Planar ledges 18 and 19 are located adjacent portion 16 along the channel 14 and are symmetrically formed on both sides of the channel 14. Indentations 20 are also located symmetrically about portion 16 and are configured to have the same depth as channel 14. The ledges 18 and 19 form surfaces on which air-striplines are received as will be subsequently described. The depth of the channel 14 may vary along portion 16 to form the appropriate transmission line cavities in connection with the air-stripline transmission lines as will be understood from the following description.

Figure 5:
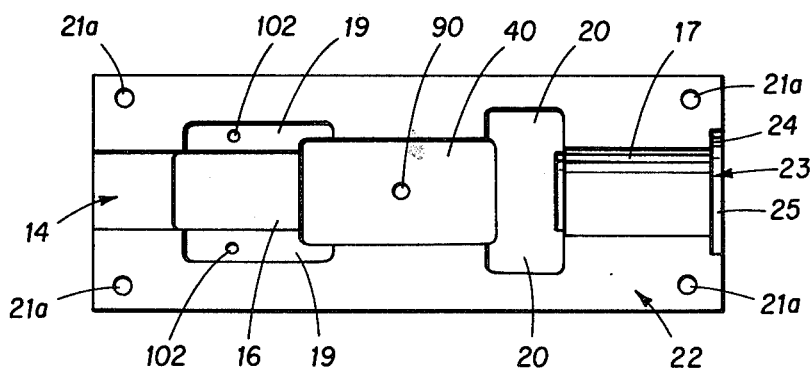
FIG. 5 is a bottom view of the cover of the impedance matching device.

The support 12 also includes a plurality of threaded holes 21 which are used to fasten a mating cover 22 (FIG. 5) over and in alignment with the support 12. A semi-cylindrical counter-bore 23 in the end of support 12 forms a semi-cylindrical ledge 24 and wall 25 at the end of portion 17. An opening 26 extends generally perpendicular to the surface 15 of the support 12 and is located so that it opens centrally between the walls of the channel 14 in the portion 16. The opening 26 is threaded and receives a threaded mounting stud 28. The mounting stud 28 includes a threaded opening 30 which is coaxial with opening 26. Mounting stud 28 receives an IMPATT diode 32 mounted on one end of a threaded stud 34. The threaded stud 34 positions the diode so that it extends above the bottom of channel 14 when studs 28 and 34 are located within their respective openings 26 and 30. Typically the diode will have a flat end portion which is positioned parallel to the bottom of channel 14 and projects into the channel by approximately 20 mils when the surface 36 of the stud 28 is flush with the bottom of channel 14.

The rectangular cover 22 is constructed to cooperate with the support 12 to form a housing 38 which encompasses the microwave tuning elements of the impedance device 10. The cover 22 includes a channel 14 of substantially identical configuration to the support 12 as noted by the similar numerals except for the rectangular cavity 40 which is located between the ledge portion 19 and indentations 20 along the axis of the channel 14. The cover 22 is designed to cooperate with support 12 so that the channels 14 in each of the cover 22 and support 12 are in opposed parallel relationship when forming the housing 38. The cover 22 has holes 21a positioned to align with holes 21 in support 12 when arranged to form a mating relationship. Holes 21a receive bolts 27 which in turn threadably engage holes 21 for rigidly mating the cover 22 to support 12.

Referring now to FIG. 2, an air-stripline board 42 is positioned horizontally across the channel 14 on ledges 19 at one end of the support 12. The air-stripline board 42 includes a conventional Teflon-fiberglass board 44 having an electrically conductive strip 46 extending between the edges of the board 42 parallel to the axis of the channel 14. The conductive strip 46 is located on both sides of the board 44 and is electrically interconnected. The strip 46 includes a pair of electrical contacts 48, one extending from strip 46 on each side of the board 42. The contacts 48 are spring-biased toward one another to form a tweezer action for receiving a second air-stripline board 50 while allowing movement of board 42 along channel 14. The second air-stripline board 50 is of similar construction to the air-stripline board 42 with the exception that board 50 is stationarily positioned at one end of the support 12 on ledges 18. The contacts 48 of air-stripline board 42 engage strip conductor 46 of air-stripline board 50 allowing air-stripline board 42 to move freely along the length of the channel 14 on the ledges 19 while maintaining electrical contact between strips 46 of both boards 42 and 50. In the present instance, a connector 52, which is shown as a conventional coaxial cable, has its inner conductor 54 connected to the strip 46 of air-stripline board 50 at an opposite edge from the board 42, and its outer conductor 56 electrically connected to the support 12 and cover 22 by plate 57 retained by screws 59. The connector 52 is used as an output coupling for the impedance matching device 10. It will be apparent, however, that other connectors could be used depending on where the power output from the diode is to be coupled. The support 12 could also include other power coupling or combining circuits (e.g., air-stripline transmission lines) without providing a specific output connector. It is understood that the channel 14 surrounding air-stripline boards 42 and 50 is configured to transmit microwave energy through the transmission lines formed by boards 42 and 50.

Referring again to FIGS. 1 and 2, a resonator/filter 58 is located within the channel 14 adjacent the board 42 and coupled for movement in the channel 14 in line with the conductive strip 46. The resonator/filter 58 includes an electrically conductive resonator 60 having a generally rectangular configuration which, for example, may have dimensions of 0.1 inch (2.54 mm) thickness, 0.2 inches (5.08 mm) width, and 0.280 inches (7.11 mm) length. An electrically conductive bias filter is attached to the resonator 60 and has a first portion 62 having the same thickness and length as the resonator but a reduced width of 0.062 inches (1.57 mm). The first portion 62 is coupled to a second portion 64 having the same dimensions as the resonator 60. The portions 62 and 64 form a bias filter which is designed to provide a low impedance, electrically conductive path for coupling a DC voltage to the IMPATT diode while providing a high impedance path to microwave energy generated by the IMPATT diode. The bias filter sections 62 and 64 can be lengthened by adding any number of combined sections 62 and 64.

The resonator 60 and the filter portions 62 and 64 are each designed to have a quarter wavelength so that the end portion 64 appears as an open circuit to the IMPATT diode 32 yet provides an electrically conductive path for the DC bias current. An electrically insulating pad 66, which in the present instance may be Teflon, can be positioned transversely in indentations 20 across the bottom of channel 14. The indentations 20 retain the pad 66 so that it remains stationary in the channel 14. The Teflon pad may have a thickness of 15 mils and is designed to prevent electrical contact of the electrically conductive portions 62 and 64 with the electrically conductive support plate 12 during the movement of the resonator/bias filter 58. The resonator 60 also includes a groove 68 having a uniform depth of 5 mils which is configured to receive the projecting portion of IMPATT diode 32 and allow longitudinal movement of the resonator along channel 14 while preventing lateral movement of the resonator within the channel. The groove 68 extends parallel to the axis of the channel 14 and provides the surface making electrical contact between the resonator 60 and IMPATT diode 32 while spacing the bottom surface of resonator 60 uniformly from the bottom of channel 14 by a distance of 15 mils.

An electrically conductive rod 70 having a threaded end portion 72 extends from filter portion 64 parallel to the channel 14. The rod 70 has a length which extends beyond an end of the support block 12 when positioned for operation and movement in channel 14. An electrically non-conductive flanged cylinder having a cylindrical body 74 and a circumferential flange 76 at one end has a threaded opening 77 which receives the threaded end portion 72 of rod 70. A retaining plate 78 having a cylindrical opening 80 receives cylindrical body 74 to position the flange 76 in semi-cylindrical counter-bore 23 of the cover 22 and support 12. The retaining plate 78 is attached to the support 12 and cover 22 by screws 82 and holds the flange 76 within counter-bore 23 so that the cylindrical body 74 may be rotated about an axis coaxial with the axis of channel 14. The dimensions of the cylindrical body 74 are such that it may be rotated to move threaded end 72 thereby causing movement of the attached rod 70 and attached resonator/filter 58 along the channel 14. Movement of the resonator 60 causes a variation in the resonator position with respect to diode 32 and thus produces a change in the imaginary component of impedance presented to diode 32. An electrically conductive terminal 84, which in the present instance may be a wire terminal, is coupled to extend through the opening 75 in cylindrical body 74 and may be attached to a source of DC voltage for providing the bias to initiate IMPATT diode oscillation. A cylindrical ferrite sleeve 79 is configured to have dimensions so that it may be received in the cylindrical channel formed by the mating semi-cylindrical portions 17 in support 12 and cover 22. The opening 81 in sleeve 79 receives and allows movement of rod 70 along the axis of channel 14.

An electrically non-conductive flanged member, shown as a cylindrical rod 86 having a flange 88 at one end, extends through the top side of cover 22 through opening 90 and cavity 40 to a position within the channel 14 formed by the cooperation of cover 22 and support 12. In the present example, the rod 86 may be a Rexolite sleeve which has the flange 88 located on the top of cover 22. A spring strip 92 is attached at one end by screw 96 to the top surface 94 of the cover 22. The other end of the spring strip 92 is designed to bear against flange 88 to resiliently force sleeve 86 into contact with resonator 60 when the cover is securely attached and mated with the support 12 to form housing 38. A groove 98 is located in the top surface of resonator 60 and extends parallel to the channel 14 enabling sliding contact between the resonator 60 and sleeve 86. The contact of the sleeve 86 with the resonator 60 maintains the resonator 60 in contact with diode 32 for movement along the channel 14 while preventing lateral movement of the resonator 60 in the channel 14. In accordance with the dimensions previously noted, the bottom surface of the resonator 60 would be spaced uniformly from the bottom of channel 14 by a distance of 15 mils.

The operation of the device will now be described with reference to FIGS. 2, 3 and 4. When the cover 22 and support 12 are mated to form the housing 38, the resonator 60 is positioned beneath cavity 40 in channel 14 and can be moved with respect to IMPATT diode 32 by rotation of cylindrical body 74. Cylindrical body 74 moves the threaded end 72 which in turn causes simultaneous movement of rod 70 and members 64, 62 and resonator 60. Grooves 98 and 68 in cooperation with diode 32 and sleeve 86 maintain the resonator 60 in a position symmetrically and uniformly spaced from the side walls of channel 14 and uniformly spaced from the bottom of channel 14 during movement of the resonator 60. As constructed, the impedance matching device 10 includes two adjustments for matching impedance of the diode with any coupling circuit. In the first case, rotation of cylinder 74 causes movement of a resonator 60 along the channel 14 with respect to diode 32. This changes the length of the quarter wave resonator electrically attached to the diode and therefore varies the frequency and, thus, the imaginary component of impedance presented to the diode 32. The air-stripline board 42 is additionally movable with respect to the board 50 and the resonator 60. The air-stripline board 42 may be moved by inserting probes through openings 102 in cover 22 to vary its position on ledges 19 along channel 14. Movement of the air-stripline board 42 changes the gap 100 between the resonator 60 and conductive strip 46 on the air-stripline board 42 and thus varies the capacitance or coupling to the resonator 60. This movement of the air-stripline board 42 changes the real part of the impedance presented to the diode 32. Accordingly, both the real and imaginary parts of the impedance presented to the diode 32 may be adjusted to couple the output power from the diode to a transmission line or network (in the present instance, air-stripline board 50) for power distribution. The ferrite sleeve 79 acts to absorb any microwave power that might otherwise leak beyond portion 64.

Using the above-described arrangement, it has been found that there is a tuning range of 1 GHz at X band enabling an adjustment between 8.9 and 9.9 GHz with flat power output. The construction of the resonator 60 and portions 62 and 64 produces a high impedance for the diode contact at both the fundamental and half-harmonic frequencies. This aids in preventing undesirable oscillations at the half-harmonic frequency. The adjustment capabilities of the device therefore allow IMPATT diodes of various characteristics to be employed in the arrangement for matching with transmission lines or other devices.

As can be seen from the above description, the present invention allows a simple and inexpensive structure to be manufactured for tunably matching diodes to loads. The device can be constructed with miniaturized components of conventional technology and with a versatility enabling applications in various environments. The device, while being tunable, allows for the bias voltage to be supplied to the IMPATT diode without related power losses and undesirable frequency generation. The structure is therefore tunable in both frequency and coupling without requiring numerous critical tolerances to facilitate that coupling. The structure, by use of the air-stripline technology, is inherently less lossy than conventional microstrip designs and therefore provides more efficient power coupling. The construction of the device is additionally lower cost than other microstrip and cavity techniques and is shaped in a modular configuration which enables multiple modules to be combined with air-stripline combining networks. These are all advantages and features which are not taught or suggested by the prior art.

While the invention has been described with reference to particular configurations and dimensions, it is apparent that other configurations and dimensions could be used depending on the frequencies and impedances involved. In addition, the adjusting elements used to move the resonator 60 and air-stripline 42 may be made in a variety of ways to accomplish the same movement and bias contact. Multiple devices 10 may be arranged in a single electrically conductive support and interconnected by appropriate transmission line coupling to combine the power outputs of each of the semiconductor devices. Obviously many other modifications and variations of the invention are possible in light of the above teachings. It is therefore to be understood that within the scope of the appended claims, the invention may be practiced otherwise than as specifically described.

What is claimed is:

1. An impedance tuning circuit comprising:
    an electrically conductive member having a channel formed therein;
    means for receiving a frequency generating semiconductor device in said channel;
    a resonator means movably positioned within said channel for contacting a semiconductor device for varying the imaginary component of impedance presented to a semiconductor device; and
    transmission line means positioned in said channel adjacent said resonator means and movable along said channel with respect to said resonator for varying the component of real impedance presented to a semiconductor device.

2. The apparatus of claim 1 further including means coupled to said transmission line means for providing a signal output from said transmission line means, and means coupled to said resonator means for providing an electrical bias voltage to a semiconductor device to induce frequency generation.

3. The apparatus of claim 2 wherein said means for receiving a semiconductor device receives and positions an IMPATT diode in contact with said resonator means.

4. The apparatus of claim 1 wherein said electrically conductive member is an electrically conductive plate forming a ground plane and having a channel extending the length thereof and further including an electrically conductive cover having a corresponding channel positioned over said plate to form a housing within which said resonator and transmission line means are retained.

5. The apparatus of claim 4 further including means retained in said cover for forcefully positioning said resonator in sliding contact with a semiconductor device.

6. An impedance tuning power coupling circuit comprising:
    an electrically conductive planar support plate;
    a channel extending along a length of said support plate and having a bottom portion and generally parallel side portions;
    a frequency generating semiconductor device;
    means for receiving and positioning said semiconductor device in said channel through said bottom portion;
    transmission line means slidably positioned in said channel for movement along said channel substantially parallel to the bottom portion for changing the real component of impedance presented to said semiconductor device;
    a movable electrically conductive resonator means positioned adjacent said transmission line means and in electrical contact with said semiconductor device and spaced from said bottom portion for sliding movement along the same axis as said transmission line means and parallel to said bottom portion for changing the imaginary component of impedance presented to the semiconductor device;
    means coupled to said support plate and to said resonator means for moving said resonator means along said channel;
    means coupled to said moving means for providing a DC voltage through said resonator means to said semiconductor device for inducing frequency generation; and
    means for forcefully maintaining said resonator means in sliding electrical contact with said semiconductor device.

7. The apparatus of claim 6 wherein said resonator means includes first, second and third electrically conductive portions, said semiconductor device being maintained in contact with said first portion, and each of said portions having a quarter wavelength.

8. The apparatus of claim 6 wherein said means for moving said resonator means includes:
    an electrically conductive rod coupled to said resonator means and having a threaded end portion extending through said channel to one end of said support plate;
    an electrically non-conductive means having threads for receiving said threaded end portion;
    a means coupled to said support plate for retaining said electrically non-conductive means for rotation therein so that rotation of said electrically non-conductive means causes movement of said rod and corresponding movement of said resonator means along said channel.

9. The apparatus of claim 8 wherein said means for providing a DC voltage comprises an electrically conductive terminal coupled from the threaded end of said rod to a source of DC voltage.

10. A microwave impedance tuning circuit for power coupling IMPATT diodes comprising:
- an electrically conductive planar support member having a U-shaped channel formed through a surface thereof;
- an IMPATT diode capable of generating frequencies in the microwave regions;
- a means for receiving and positioning said IMPATT diode in said support plate so that it extends through the bottom portion in said channel centrally within said channel;
- a movable air-stripline transmission line slidably positioned for movement along said channel at one end thereof;
- means coupled to said transmission line for providing an output terminal;
- a movable electrically conductive metallic member forming a resonator/bias filter positioned adjacent said transmission line and in electrical contact with said IMPATT diode for slidable movement parallel to the bottom portion of said channel adjacent said transmission line, said resonator/bias filter having a first quarter wave portion forming a resonator and maintained in contact with said IMPATT diode, and second and third quarter wave portions serially connected to said first portion for forming a bias filter;
- an electrically conductive rod coupled to said third portion of said resonator and extending along said channel to an opposite end of said support member, said rod having a threaded end extending from said opposite end of said support member;
- a retaining member coupled to said opposite end of said support member;
- an electrically non-conductive flanged cylindrical member received by said retaining member for rotational movement therein, said cylindrical member receiving the threaded end of said rod in such manner that rotation of said cylindrical member will engage the threads on said rod and move the rod and coupled resonator along said channel parallel to said bottom portion of said channel;
- means for providing a voltage through said rod and resonator to said IMPATT diode for generating microwave power;
- an electrically conductive cover having a channel corresponding to the channel in said support and positioned over said support to form a housing retaining said rod, resonator and transmission line; and
- means coupled to said housing and bearing against said resonator for maintaining said resonator in electrical contact with said IMPATT diode.

11. The apparatus of claim 10 wherein said means for bearing against said resonator includes a spring strip coupled to said cover, and an electrically non-conductive flanged sleeve extending through said cover into contact with said resonator and maintained in contact with said resonator by the force of said spring strip.

12. The apparatus of claim 10 further including a ferrite cylinder positioned in said channel and surrounding a portion of said rod for absorbing microwave energy.

* * * * *